(12) United States Patent
Min (10) Patent No.: US 11,320,490 B2
(45) Date of Patent: May 3, 2022

(54) SHUNT RESISTOR AND APPARATUS FOR DETECTING CURRENT INCLUDING THE SAME

(71) Applicant: LG Chem, Ltd., Seoul (KR)

(72) Inventor: Kyoung-Choon Min, Daejeon (KR)

(73) Assignee: LG Energy Solution, Ltd.

( * ) Notice: Subject to any disclaimer, the term of this patent is extended or adjusted under 35 U.S.C. 154(b) by 192 days.

(21) Appl. No.: 16/635,403

(22) PCT Filed: Mar. 25, 2019

(86) PCT No.: PCT/KR2019/003452
§ 371 (c)(1),
(2) Date: Jan. 30, 2020

(87) PCT Pub. No.: WO2019/190144
PCT Pub. Date: Oct. 3, 2019

(65) Prior Publication Data
US 2020/0182936 A1    Jun. 11, 2020

(30) Foreign Application Priority Data
Mar. 28, 2018   (KR) .................. 10-2018-0035972

(51) Int. Cl.
*G01R 31/364* (2019.01)
*G01R 1/20* (2006.01)
(Continued)

(52) U.S. Cl.
CPC .............. *G01R 31/364* (2019.01); *G01R 1/20* (2013.01); *H01M 10/48* (2013.01); *H01M 50/529* (2021.01); *H01M 50/572* (2021.01)

(58) Field of Classification Search
None
See application file for complete search history.

(56) References Cited

U.S. PATENT DOCUMENTS

2012/0229247 A1   9/2012   Yoshioka
2013/0187575 A1*  7/2013   Yugou ............... H02P 23/14
                                              318/139
(Continued)

FOREIGN PATENT DOCUMENTS

CN        2634608 Y    8/2004
CN        1545106 A    11/2004
(Continued)

OTHER PUBLICATIONS

International Search Report for Application No. PCT/KR2019/003452 dated Jul. 4, 2019, 2 pages.
(Continued)

*Primary Examiner* — Jas A Sanghera
(74) *Attorney, Agent, or Firm* — Lerner, David, Littenberg, Krumholz & Mentlik, LLP (57) ABSTRACT

A shunt resistor for enhancing accuracy of current detection in the process of detecting current flowing through the shunt resistor and an apparatus for detecting current including the same. The shunt resistor includes two busbars made of an electrically conductive material and spaced apart a predetermined distance, a first connection element made of an electrically conductive material and configured to be mounted in a first busbar provided on one side among the two busbars, and a second connection element made of an electrically conductive material and configured to be mounted in a second busbar provided on the other side among the two busbars. The first connection element and the second connection element are configured to have an increase or decrease in an area of direct or indirect contact between the first connection element and the second connection element.

11 Claims, 9 Drawing Sheets

(51) Int. Cl.
*H01M 10/48* (2006.01)
*H01M 50/529* (2021.01)
*H01M 50/572* (2021.01)

(56) References Cited

U.S. PATENT DOCUMENTS

| | | |
|---|---|---|
| 2013/0314827 A1 | 11/2013 | Sohn |
| 2014/0097933 A1 | 4/2014 | Yoshioka et al. |
| 2015/0245490 A1 | 8/2015 | Kondou et al. |
| 2017/0003322 A1 | 1/2017 | Nakamura et al. |
| 2017/0125142 A1 | 5/2017 | Nakamura et al. |
| 2017/0192038 A1 | 7/2017 | Kawamoto |
| 2017/0212148 A1 | 7/2017 | Hetzler |
| 2018/0286542 A1 | 10/2018 | Kobayakawa et al. |
| 2019/0004094 A1 | 1/2019 | Park et al. |
| 2019/0295749 A1 | 9/2019 | Endo |

FOREIGN PATENT DOCUMENTS

| | | |
|---|---|---|
| CN | 102640233 A | 8/2012 |
| CN | 105980864 A | 9/2016 |
| JP | S50092275 U | 8/1975 |
| JP | S59191673 U | 12/1984 |
| JP | 2001349907 A | 12/2001 |
| JP | 20050136339 A | 5/2005 |
| JP | 2007141907 A | 6/2007 |
| JP | 2009266977 A | 11/2009 |
| JP | 2012155949 A | 8/2012 |
| JP | 2014056951 A | 3/2014 |
| JP | 2017076708 A | 4/2017 |
| JP | 2017076709 A | 4/2017 |
| JP | 2017208475 A | 11/2017 |
| JP | 2017212297 A | 11/2017 |
| KR | 20020050588 A | 6/2002 |
| KR | 101393104 B1 | 5/2014 |
| KR | 20180013466 A | 2/2018 |
| WO | 2013005824 A1 | 1/2013 |
| WO | 2015156247 A1 | 10/2015 |

OTHER PUBLICATIONS

Extended European Search Report for EP Patent Application No. 19778075.2, dated Jan. 12, 2021, 8 pages.
Rara Intern:, Rara website, "SH-T Series Shunt Resistors", Dec. 26, 2013, pp. 1-5, XP05576097.
Search Report for Chinese Application No. 201980004715.5 dated Sep. 22, 2021. 3 pgs.

* cited by examiner

FIG. 9

US 11,320,490 B2

SHUNT RESISTOR AND APPARATUS FOR DETECTING CURRENT INCLUDING THE SAME

CROSS-REFERENCE TO RELATED APPLICATIONS

The present application is a national phase entry under 35 U.S.C. § 371 of International Application No. PCT/KR2019/003452 filed Mar. 25, 2019, published in Korean, which claims priority from Korean Patent Application No. 10-2018-0035972 filed Mar. 28, 2018, all of which are incorporated herein by reference.

TECHNICAL FIELD

The present disclosure relates to a shunt resistor and an apparatus for detecting current including the same, and more particularly, to an improved shunt resistor for enhancing accuracy of current detection in the process of detecting current flowing through the shunt resistor and an apparatus for detecting current including the same.

BACKGROUND ART

Recently, there is dramatically growing demand for portable electronic products such as laptop computers, video cameras and mobile phones, and with the extensive development of accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, a very low self-discharge rate and high energy density.

Batteries are used in a wide range of applications, and in many cases, large capacity is required in commercial applications in which batteries are widely used in recent years, such as electric-drive vehicles or smart grid systems. To increase the capacity of battery packs, there may be a method that increases the capacity of secondary batteries or battery cells themselves, but in this case, the capacity increase effect is not so large, and there is a physical limitation on the size expansion of the secondary batteries, and another disadvantage is inconvenient management. Accordingly, generally, a battery pack including battery modules connected in series and in parallel is widely used.

When secondary batteries are used in the form of an assembly, for example, the unit secondary batteries may be swollen and damaged by overheat in the event that maloperation occurs due to a flow of overcurrent. Accordingly, it is necessary to always measure and monitor the state values of each unit secondary battery such as voltage and temperature in order to prevent each unit secondary battery from being overcharged or overdischarged.

Conventionally, the state of the battery pack is diagnosed by installing a voltage measuring shunt resistor at a component included in the battery pack such as a bus bar, and calculating the current flowing through the shunt resistor based on the measured voltage value. However, when shunt resistors and measurement devices are used to obtain measured values with high reliability, the number of busbars increases, and the battery pack increases in volume and price. The volume increase of the battery pack has an adverse influence on high efficiency and high energy density.

Accordingly, because it is necessary to reduce the size of the battery pack in order to improve the efficiency and energy density of the battery pack, there is a need to improve reliability of voltage and current measurement of the shunt resistor.

SUMMARY

Technical Problem

The present disclosure is designed under the background of the conventional art described above, and therefore, the present disclosure is directed to providing an improved shunt resistor for enhancing accuracy of current detection in the process of detecting current flowing through the shunt resistor and an apparatus for detecting current including the same.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

To achieve the above-described object, a shunt resistor according to an embodiment of the present disclosure includes a first busbar, wherein the first busbar is electrically conductive, a second busbar, wherein the second busbar is electrically conductive and spaced apart a predetermined distance from the first busbar, a first connection element, wherein the first connection element is electrically conductive and configured to be mounted to the first busbar, and a second connection element, wherein the second connection element is electrically conductive and configured to be mounted to the second busbar, wherein the first connection element and the second connection element are configured to have a variable area of direct or indirect contact between one another.

Additionally, the first connection element and the second connection element may be configured to have a variable area of direct contact between one another, the first busbar and the second busbar may be spaced apart along a lengthwise direction, the first connection element may include a first interlock that protrudes from the first busbar toward the second busbar along the lengthwise direction, the second connection element may include a second interlock that protrudes from the second busbar toward the first busbar along the lengthwise direction, and the first connection element and the second connection element may be configured to directly contact each other when the first interlock and the second interlock are engaged with each other.

Additionally, the first interlock may include a first set of teeth protruding upwards, the second interlock may include a second set of teeth protruding downwards, and the teeth the first set of teeth of the first interlock and of the second set of teeth of the second interlock may have matching shapes.

Additionally, when the first interlock and the second interlock are engaged with each other, the area of direct contact between the first interlock and the second interlock may be configured to vary as the first connection element and the second connection element move in the lengthwise direction.

Additionally, in the shunt resistor according to an embodiment of the present disclosure, each of the first set of teeth and the second set of teeth may include at least two teeth, and as the first connection element and the second connection element move in the lengthwise direction, a number of engaged teeth changes, and the area of direct contact between the first interlock and the second interlock may increase or decrease.

Additionally, the first connection element and the second connection element may be configured to have a variable area of indirect contact between one another, the first busbar and second busbar may be spaced apart along a lengthwise direction, the first connection element may include a first plurality of protrusion portions protruding in a direction towards the second connection element, the second connection element may include a second plurality of protrusion portions protruding in a direction towards the first connection element, the first and second pluralities of protrusions may be spaced apart from each other in each of the lengthwise direction and a vertical direction, and the shunt resistor according to an embodiment of the present disclosure may further include at least one resistor bar mounted between the first connection element and the second connection element, and wherein the at least one resistor bar may include a plate having a first side mounted between two protrusion portions of the first connection element, and a second side mounted between two protrusion portions of the second connection element.

Additionally, the at least one resistor bar may be configured to be detachable from the first connection element and the second connection element.

Additionally, the first connection element may include a first concave portion on a surface of the first connection element configured to contact the second connection element, the second connection element may include a second concave portion on a surface of the second connection element configured to contact the first connection element, when the respective surfaces of the first and second connection elements contact one another, the first and second concave portions may form a cavity where the first connection element and the second connection element contact, and the shunt resistor according to an embodiment of the present disclosure may further include at least one resistor block configured to be inserted into the cavity.

Additionally, the cavity may be formed in a conic shape, and the shunt resistor may include a plurality of resistor blocks, and each of the plurality of resistor blocks may be formed in a conic shape, may be a different size, and may be configured to be detachable from the cavity.

In addition, to achieve the above-described object, an apparatus for detecting current according to an embodiment of the present disclosure includes a first busbar, wherein the first busbar is electrically conductive, a second busbar, wherein the second busbar is electrically conductive and spaced apart a predetermined distance from the first busbar, a first connection element, wherein the first connection element is electrically conductive and configured to be mounted to the first busbar, and a second connection element, wherein the second connection element is electrically conductive and configured to be mounted to the second busbar, and a current detector electrically connected to the first connection element and the second connection element, and configured to detect a current flowing between the first busbar and the second busbar based on a voltage applied between the first connection element and the second connection element, wherein the first connection element and the second connection element may be configured to have a variable area of direct or indirect contact between one another.

In addition, to achieve the above-described object, a battery pack according to an embodiment of the present disclosure includes the apparatus for detecting current according to the present disclosure.

Advantageous Effects

According to an aspect of the present disclosure, the resistance value of the shunt resistor may be decreased or increased. Additionally, a plurality of resistor bars or resistor blocks having various shapes may be provided to make fine adjustments of the resistance value of the shunt resistor.

Particularly, it is possible to detect the current flowing through the shunt resistor by adjusting the resistance value of the shunt resistor conveniently and accurately through selection of the number of resistor bars or resistor blocks.

The present disclosure may have a variety of other effects, and these and other effects can be understood by the following description and will be apparent from the embodiments of the present disclosure.

BRIEF DESCRIPTION OF DRAWINGS

The accompanying drawings illustrate a preferred embodiment of the present disclosure, and together with the following detailed description of the present disclosure, serve to provide a further understanding of the technical aspects of the present disclosure, and thus the present disclosure should not be construed as limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements. Additionally, the term 'detection unit' as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 1:
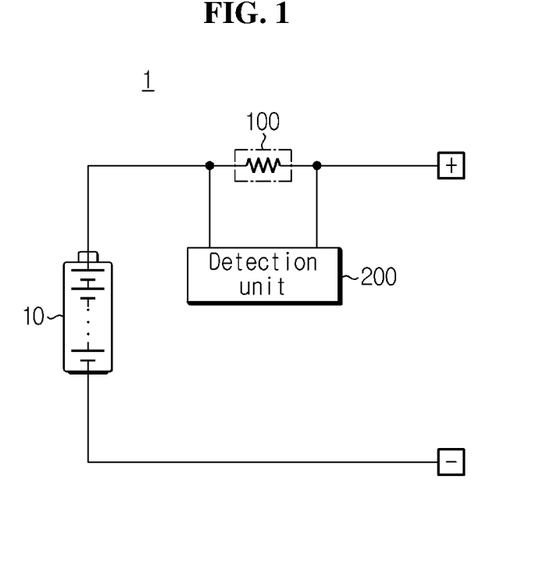
FIG. 1 is a schematic diagram showing an apparatus for detecting current connected to components of a battery pack according to an embodiment of the present disclosure.
Figure 2:
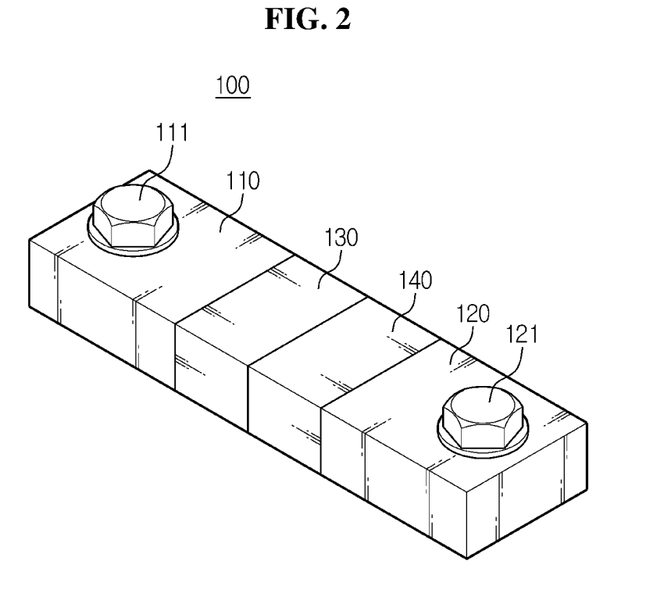
FIG. 2 is a schematic perspective view showing a shunt resistor according to an embodiment of the present disclosure.

FIG. 1 is a schematic diagram showing an apparatus for detecting current connected to components of a battery pack according to an embodiment of the present disclosure, and FIG. 2 is a schematic perspective view showing a shunt resistor according to an embodiment of the present disclosure.

Referring to FIGS. 1 and 2, the shunt resistor 100 according to an embodiment of the present disclosure may be provided in a battery pack 1 in itself. That is, the battery pack 1 according to the present disclosure may include the shunt resistor 100 or the apparatus for detecting current according to the present disclosure as described below. Here, the battery pack 1 may include at least one secondary battery 10, the shunt resistor 100, the apparatus for detecting current, electrical equipment (Battery Management Systems (BMS), relays, fuses, etc.) and a case.

For example, as shown in the configuration of FIG. 1, the shunt resistor 100 according to the present disclosure may be provided in the battery pack 1. Additionally, the shunt resistor 100 may be electrically connected to one terminal of the secondary battery 10. Additionally, two terminals of the shunt resistor 100 may be electrically connected to a detection unit 200. Here, the apparatus for detecting current according to the present disclosure may include the shunt resistor 100 and the detection unit 200. In more detail, the charge/discharge current flowing between the positive terminal of the battery pack 1 and the positive terminal of the secondary battery 10 may flow through the shunt resistor 100. Additionally, the detection unit 200 may detect an amount of current flowing through the shunt resistor 100 by measuring the voltage across the two terminals of the shunt resistor 100.

The shunt resistor 100 according to an embodiment of the present disclosure includes two busbars, a first connection element 130 and a second connection element 140.

The two busbars may be made of an electrically conductive material. Through this configuration, current can flow in the two busbars. Additionally, the two busbars may be spaced apart a predetermined distance. Here, the two busbars may include a first busbar 110 provided on one side and a second busbar 120 provided on the other side. For example, as shown in the configuration of FIG. 2, the first busbar 110 and the second busbar 120 may be spaced apart a predetermined distance in a lengthwise direction on the same plane. Here, the lengthwise direction is a direction from the first busbar 110 toward the first connection element 130, and the second connection element 140 and the second busbar 120 may be disposed from the first busbar 110 toward the lengthwise direction. For example, referring to FIG. 2, the lengthwise direction may include a direction of an imaginary extension line connecting a first connection terminal 111 and a second connection terminal 121.

Preferably, as shown in the configuration of FIG. 2, the first busbar 110 and the second busbar 120 may include the first connection terminal 111 and the second connection terminal 121. For example, the first connection terminal 111 and the second connection terminal 121 may be electrically connected to the detection unit 200.

The first connection element 130 may be made of an electrically conductive material. Additionally, the first connection element 130 may be configured to be mounted in the first busbar 110 provided on one side among the two busbars. For example, as shown in the configuration of FIG. 2, the first connection element 130 may be provided between the first busbar 110 and the second busbar 120 to determine the resistance value between the first busbar 110 and the second busbar 120. Preferably, the first connection element 130 and the first busbar 110 may be integrally formed as shown in the configuration of FIG. 2. That is, the first connection element 130 and the first busbar 110 may be integrally formed with the upper and lower surfaces arranged in parallel on the same plane.

The second connection element 140 may be made of an electrically conductive material. Additionally, the second connection element 140 may be configured to be mounted in the second busbar 120 provided on the other side among the two busbars. For example, as shown in the configuration of FIG. 2, the second connection element 140 may be provided between the first busbar 110 and the second busbar 120 to determine the resistance value between the first busbar 110 and the second busbar 120. Preferably, the second connection element 140 and the second busbar 120 may be integrally formed as shown in the configuration of FIG. 2. That is, the second connection element 140 and the second busbar 120 may be integrally formed with the upper and lower surfaces arranged in parallel on the same plane.

Additionally, one surface of the first connection element 130 may contact one surface of the second connection element 140 as shown in the configuration of FIG. 2. For example, the first connection element 130 and the second connection element 140 may be integrally formed.

Particularly, the first connection element 130 and the second connection element 140 may be configured to have an increase or decrease in the area of indirect or direct contact between the first connection element 130 and the second connection element 140. In more detail, to detect the current in the shunt resistor 100 according to the present disclosure, the voltage across the two terminals of the shunt resistor 100 is measured, and in this instance, in the configuration of FIG. 2, voltage measured between the first connection terminal 111 and the second connection terminal 121 may be used as the voltage across the two terminals of the shunt resistor 100. In this case, the first connection element 130 and the second connection element 140 may determine the resistance value between the first connection terminal 111 and the second connection terminal 121 according to the material or shape of the first connection element 130 and the second connection element 140.

For example, the first connection element 130 and the second connection element 140 may contact each other directly or indirectly. In this case, when the first connection element 130 and the second connection element 140 contact each other without intervention, this is the case in which the first connection element 130 and the second connection element 140 directly contact each other, and when any other component of an electrically conductive material is inserted between the first connection element 130 and the second connection element 140, this is the case in which the first connection element 130 and the second connection element 140 indirectly contact each other.

Additionally, when the area of contact between the first connection element 130 and the second connection element 140 increases, the resistance value between the first connection terminal 111 and the second connection terminal 121 may decrease. On the contrary, when the area of contact between the first connection element 130 and the second connection element 140 decreases, the resistance value between the first connection terminal 111 and the second connection terminal 121 may increase.

Through this configuration, the shunt resistor 100 according to the present disclosure may accurately detect the flow of current by decreasing or increasing the resistance value of the shunt resistor 100 very precisely.

The apparatus for detecting current according to an embodiment of the present disclosure includes two busbars, a first connection element 130, a second connection element 140 and a detection unit 200. A description of the two busbars, the first connection element 130 and the second connection element 140 overlaps the above description of the shunt resistor 100 and is omitted herein.

As shown in the configuration of FIG. 1, the detection unit 200 may be electrically connected to the two terminals of the shunt resistor 100. In more detail, the detection unit 200 may be electrically connected to the first connection element 130 and the second connection element 140. Alternatively, the detection unit 200 may be electrically connected to the first connection terminal 111 and the second connection terminal 121. Additionally, the detection unit 200 may detect the current flowing through the shunt resistor 100 using the voltage measured from the two terminals of the shunt resistor 100. In more detail, the detection unit 200 may detect the current flowing between the two busbars using the voltage applied between the first connection element 130 and the second connection element 140.

In this configuration, at least some components of the apparatus for detecting current according to the present disclosure may be implemented by supplementing or adding the functions of the components conventionally included in the battery. For example, the detection unit of the apparatus for detecting current according to the present disclosure may be implemented by a Battery Management System (BMS) provided in the battery pack. Here, the battery may be a concept that encompasses the battery module or the battery pack.

Figure 3:
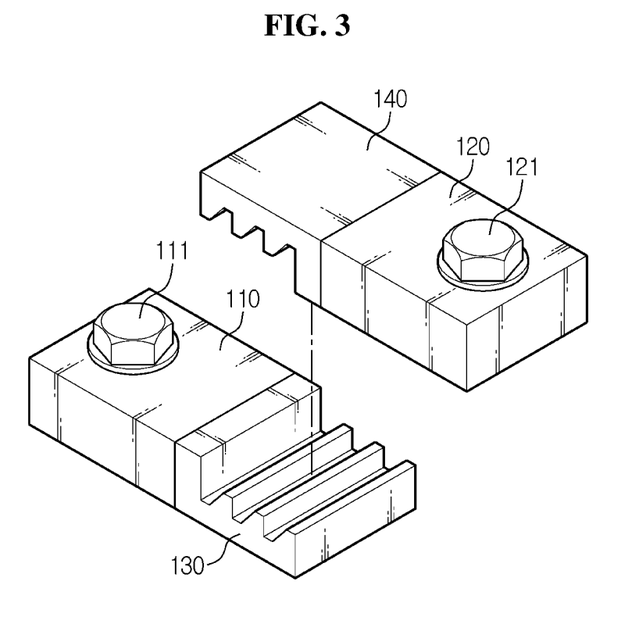
FIG. 3 is an exploded perspective view of a shunt resistor according to another embodiment of the present disclosure.
Figure 4:
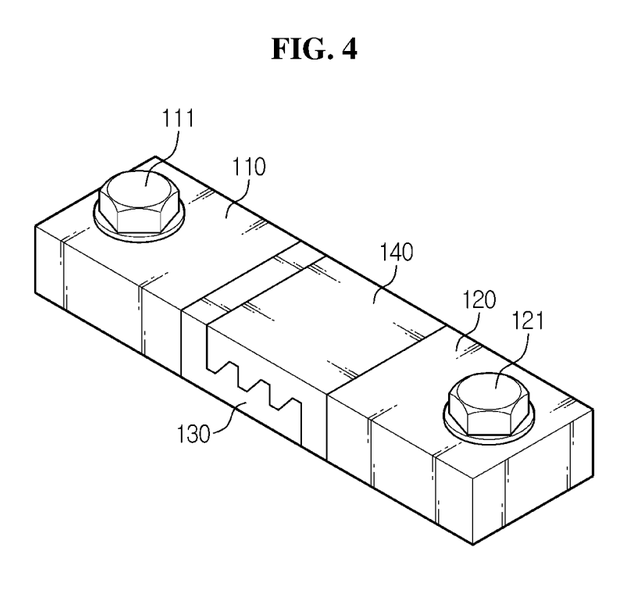
FIG. 4 is an assembled perspective view of the shunt resistor of FIG. 3.

FIG. 3 is an exploded perspective view of a shunt resistor according to another embodiment of the present disclosure, and FIG. 4 is an assembled perspective view of the shunt resistor of FIG. 3.

Referring to FIGS. 3 and 4, the first connection element 130 according to an embodiment of the present disclosure may include a first interlock. Additionally, the second connection element 140 may include a second interlock.

The first interlock may protrude perpendicular to the lengthwise direction from the first busbar 110 toward the second busbar 120 and may be formed in the shape of teeth. Additionally, the second interlock may protrude perpendicular to the lengthwise direction from the second busbar 120 toward the first busbar 110, and may be formed in the shape of teeth. Particularly, the first connection element 130 and the second connection element 140 may be configured to directly contact when the first interlock and the second interlock are engaged with each other.

Preferably, as shown in the configuration of FIG. 3, the first interlock according to an embodiment of the present disclosure may have the teeth protruding upwards. Additionally, the second interlock may have the teeth protruding downwards. Particularly, the first interlock and the second interlock may have the teeth in shapes that match each other. As opposed to the configuration shown in FIG. 3, the teeth of the first interlock may protrude downwards and the teeth of the second interlock may protrude upwards, and the first interlock and the second interlock may be engaged with each other. Additionally, the teeth of the first interlock and the teeth of the second interlock may protrude in a diagonal or horizontal direction that is perpendicular to the lengthwise direction, and may be engaged with each other.

In more detail, the teeth provided in the first interlock and the second interlock have shapes that match each other, so when the first interlock and the second interlock are engaged with each other, as shown in the configuration of FIG. 4, the shunt resistor 100 according to an embodiment of the present disclosure may be configured to have no empty space at the area where the first interlock and the second interlock meet each other. That is, according to an embodiment of the present disclosure, when the first interlock and the second interlock are engaged with each other, the first interlock and the second interlock are in close contact with each other, thereby minimizing a resistance loss resulting from spacing, and improving the reliability of voltage and current measurement of the shunt resistor 100.

Additionally, preferably, when the first interlock and the second interlock are engaged with each other, the shunt resistor 100 according to an embodiment of the present disclosure may have an increase or decrease in the area of engagement between the first interlock and the second interlock as the first connection element 130 and the second connection element 140 moves in the lengthwise direction. In more detail, as shown in the configuration of FIG. 3, the first interlock and the second interlock may be detachable. Additionally, the first interlock and the second interlock may be configured to have an increase or decrease in the area of engagement between the first interlock and the second interlock according to the number of engaged teeth.

Particularly, at least two teeth may be provided in each of the first interlock and the second interlock. For example, in the configuration of FIGS. 3 and 4, each of the first interlock and the second interlock has three teeth. Additionally, the shunt resistor 100 according to an embodiment of the present disclosure may be configured to have an increase or decrease in the area of engagement between the first interlock and the second interlock with the changes in the number of engaged teeth. For example, the first interlock and the second interlock may have single engagement where each one tooth is engaged. Additionally, the first interlock and the second interlock may have double engagement where each two teeth are engaged.

Through this configuration, the shunt resistor 100 according to the present disclosure may accurately detect the flow of current by decreasing or increasing the resistance value of the shunt resistor 100 very precisely through adjustment of the number of engaged teeth.

Figure 5:
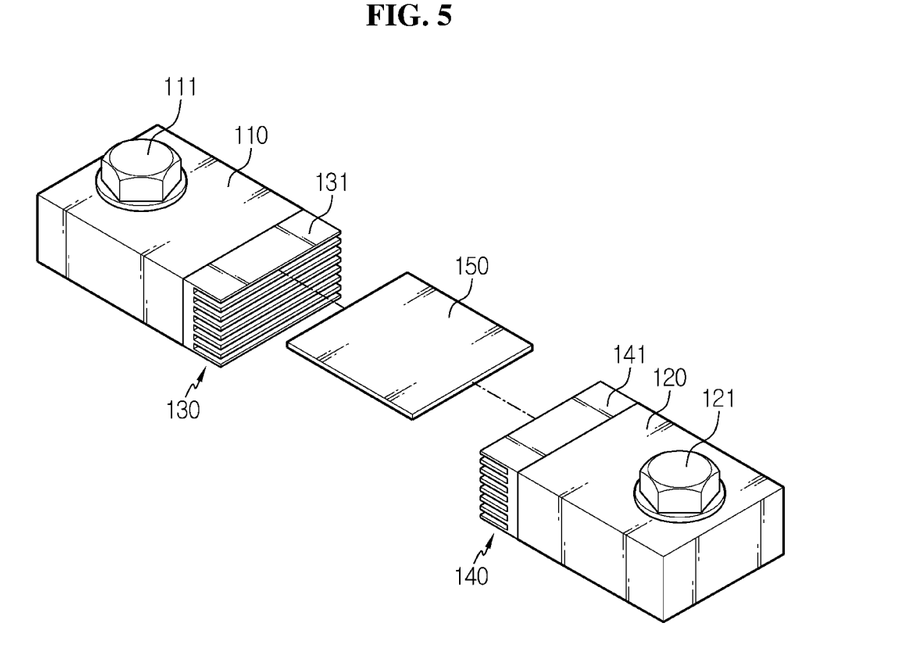
FIG. 5 is an exploded perspective view of a shunt resistor according to still another embodiment of the present disclosure.
Figure 6:
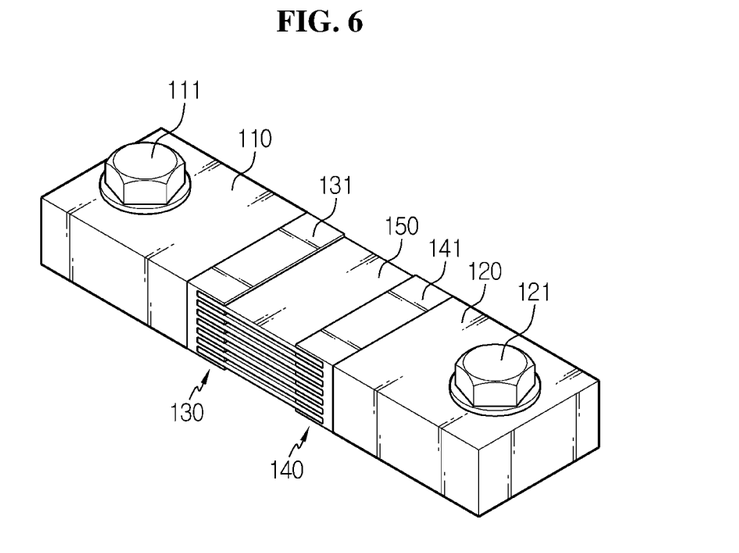
FIG. 6 is an assembled perspective view showing a resistor bar additionally coupled to the shunt resistor of FIG. 5.

FIG. 5 is an exploded perspective view of a shunt resistor according to still another embodiment of the present disclosure, and FIG. 6 is an assembled perspective view showing a resistor bar additionally coupled to the shunt resistor of FIG. 5.

Referring to FIGS. 5 and 6, the first connection element 130 and the second connection element 140 according to an embodiment of the present disclosure may be spaced apart from each other. Additionally, the first connection element 130 and the second connection element 140 may have protrusion portion. For example, as shown in the configuration of FIG. 5, the first connection element 130 and the second connection element 140 may have a plurality of protrusion portions that protrudes in directions facing each other. In this case, the plurality of protrusion portions may be spaced apart from each other in the vertical direction. In more detail, the first connection element 130 may have a plurality of first protrusion portions 131 that protrude in a direction facing the second connection element 140. Additionally, the second connection element 140 may have a plurality of second protrusion portions 141 that protrude in a direction facing the first connection element 130. Particularly, the plurality of protrusion portions may be spaced apart in parallel. Additionally, the plurality of protrusion portions may be formed in the shape of a plate with an internal space between two protrusion portions. The shunt resistor 100 according to an embodiment of the present disclosure may further include at least one resistor bar 150. The at least one resistor bar 150 may be configured to be mounted between the first connection element 130 and the second connection element 140. In more detail, the at least one resistor bar 150 may be formed in the shape of a plate, with one side mounted between two protrusion portions provided in the first connection element 130, and the other side mounted between two protrusion portions provided in the second connection element 140. For example, as shown in the configuration of FIG. 5, the resistor bar 150 may be mounted between the first connection element 130 and the second connection element 140 to indirectly connect the first connection element 130 and the second connection element 140. Additionally, the resistor bar 150 may be made of an electrically conductive material. In this case, the current may flow between the first connection element 130 and the second connection element 140 through the resistor bar 150.

However, the direction in which the plurality of protrusion portions is spaced apart is not limited to the vertical direction shown in FIGS. 5 and 6, and the plurality of protrusion portions may be spaced apart in the horizontal or diagonal direction. That is, the plurality of protrusion portions provided in the first connection element 130 may be spaced apart in a direction perpendicular to the direction (the lengthwise direction) facing the second connection element 140. Likewise, the plurality of protrusion portions provided in the second connection element 140 may be spaced apart in a direction perpendicular to the direction (the lengthwise direction) facing the first connection element 130. For example, in addition to the vertical direction shown in FIGS. 5 and 6, the plurality of protrusion portions provided in the first connection element 130 and the plurality of protrusion portions provided in the second connection element 140 may be spaced apart in the horizontal direction that is perpendicular to the lengthwise direction. In this case, the resistor bar 150 may be mounted between the protrusion portions provided in the first connection element 130 and the second connection element 140 while standing by 90° rotation around the dashed line shown in the shape shown in FIG. 5 as a rotation axis. That is, the first connection element 130 and the second connection element 140 have the protrusion portions, and may be indirectly connected through the resistor bar 150 mounted between the protrusion portions.

Additionally, in addition to the vertical direction shown in FIGS. 5 and 6, the plurality of protrusion portions provided in the first connection element 130 and the plurality of protrusion portions provided in the second connection element 140 may be spaced apart in the diagonal direction that is perpendicular to the lengthwise direction. In this case, the resistor bar 150 may be mounted between the protrusion portions provided in the first connection element 130 and the second connection element 140 by clockwise or counterclockwise rotation around the dashed line shown in the shape shown in FIG. 5 as a rotation axis. In this instance, each of the plurality of resistor bars 150 mounted between the first connection element 130 and the second connection element 140 may be formed to match the size and shape of the protrusion portions of the first connection element 130 and the second connection element 140 where the resistor bars 150 are mounted, and the size of each of the plurality of resistor bars 150 may be different.

Preferably, the resistor bars 150 may be inserted in parallel at a predetermined interval between the first connection element 130 and the second connection element 140. In this case, the protrusion portions provided in the first connection element 130 and the second connection element 140 may be formed in heights that match each other. Additionally, the plurality of protrusion portions may be formed in parallel.

Additionally, preferably, the at least one resistor bar 150 may be configured to be detachable from the first connection element 130 and the second connection element 140. Particularly, the shunt resistor 100 according to an embodiment of the present disclosure may be configured to have a decrease or increase in the area of indirect contact between the first connection element 130 and the second connection element 140 with the decreasing or increasing number of resistor bars 150 mounted between the first connection element 130 and the second connection element 140. For example, as shown in the configuration of FIG. 6, the plurality of resistor bars 150 may be mounted in the plurality of protrusion portions provided in the first connection element 130 and the second connection element 140.

Through this configuration, the shunt resistor 100 according to the present disclosure may accurately detect the flow of current by decreasing or increasing the resistance value of the shunt resistor 100 very precisely through adjustment of the number of mounted resistor bars 150.

Figure 7:
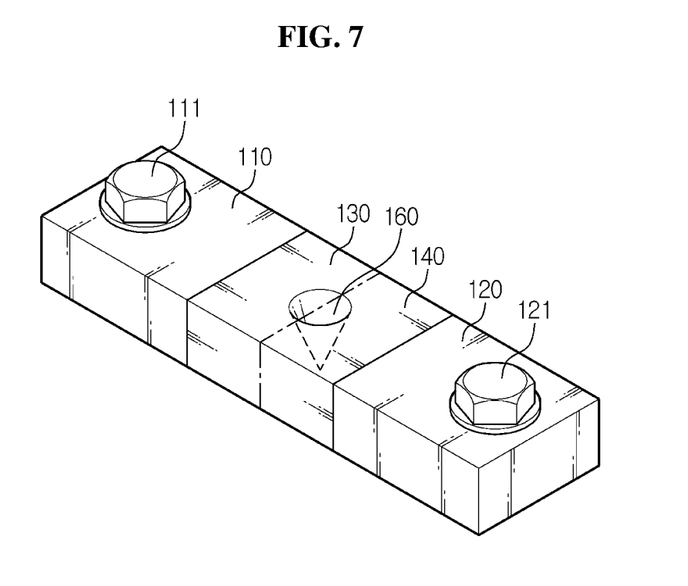
FIG. 7 is a schematic perspective view showing a shunt resistor according to yet another embodiment of the present disclosure.
Figure 8:
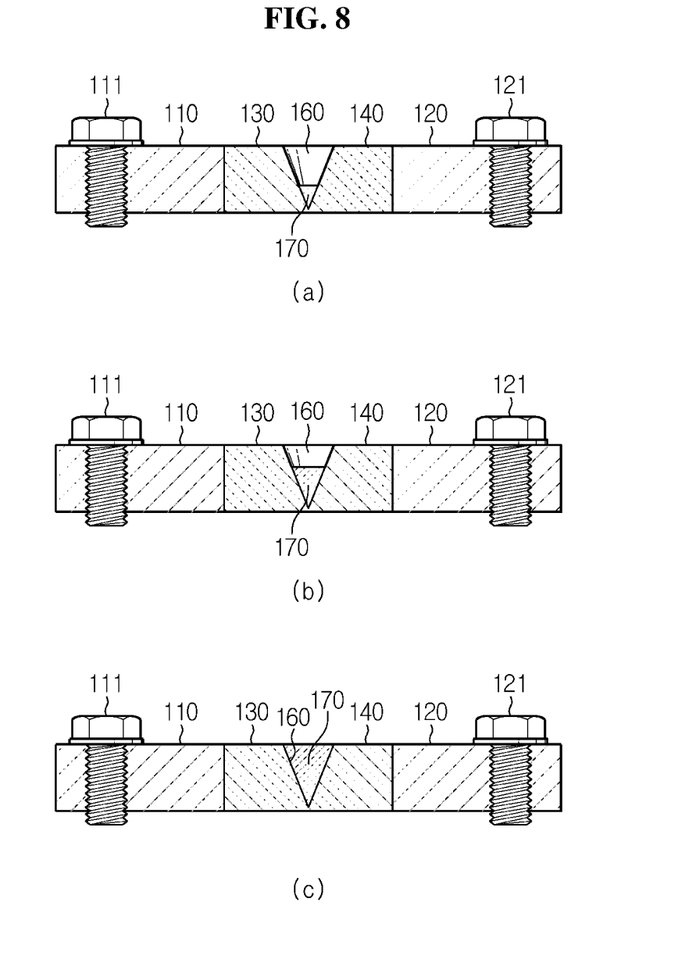
FIG. 8 is a schematic cross-sectional view showing different resistor blocks inserted into the shunt resistor of FIG. 7.

FIG. 7 is a schematic perspective view showing a shunt resistor according to yet another embodiment of the present disclosure, and FIG. 8 is a schematic cross-sectional view showing different resistor blocks inserted into the shunt resistor of FIG. 7. Additionally, FIG. 9 is a schematic perspective view showing a shunt resistor according to further another embodiment of the present disclosure.

Figure 9:
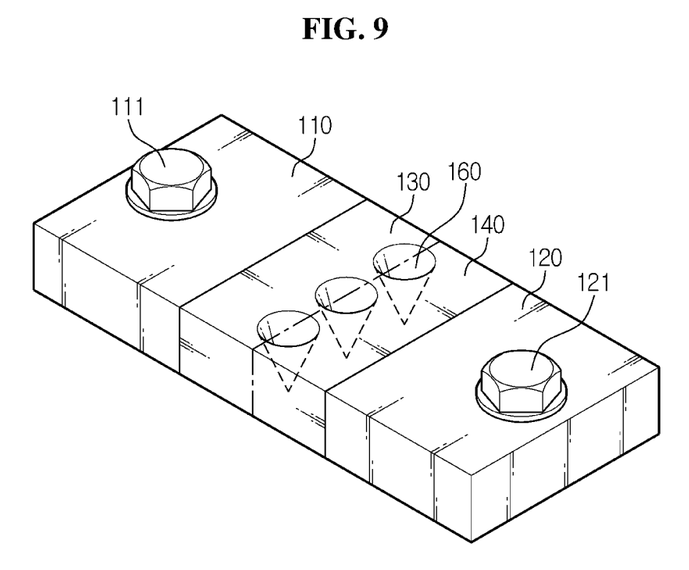
FIG. 9 is a schematic perspective view showing a shunt resistor according to further another embodiment of the present disclosure.

Referring to FIGS. 7 to 9, the first connection element 130 and the second connection element 140 according to an embodiment of the present disclosure may be configured such that one surface of the first connection element 130 contacts one surface of the second connection element 140. Alternatively, the first connection element 130 and the second connection element 140 may be integrally formed.

Additionally, the shunt resistor 100 according to an embodiment of the present disclosure may have a concave portion 160 perpendicular to the lengthwise direction at the center where the first connection element 130 and the second connection element 140 contact. For example, as shown in the configuration of FIG. 7, the concave portion 160 may be formed between the first connection element 130 and the second connection element 140. In this case, an empty space may be formed between the first connection element 130 and the second connection element 140. Additionally, when the first connection element 130 and the second connection element 140 are integrally formed, the first connection element 130 and the second connection element 140 may be distinguished each other around the area where the concave portion 160 is formed.

Preferably, the shunt resistor 100 according to an embodiment of the present disclosure may further include a resistor block 170. The resistor block 170 may be configured to be inserted into the concave portion 160. In more detail, the resistor block 170 may be formed to match the shape of the concave portion 160 and inserted into the concave portion 160. Additionally, the resistor block 170 may be made of an electrically conductive material. In this case, the current may flow between the first connection element 130 and the second connection element 140 through the resistor block 170.

In more detail, as shown in the configuration of FIG. 7, the concave portion 160 may be formed in a conic shape. Additionally, the resistor block 170 may be formed in a conic shape to match the shape of the concave portion 160.

More preferably, the resistor block 170 according to an embodiment of the present disclosure may have a plurality of conic shapes in different sizes. In this case, the resistor block 170 may be configured to be detachable from the concave portion 160. For example, (a), (b) and (c) of FIG. 8 are schematic cross-sectional views showing that the resistor blocks 170 of conic shapes in different sizes are inserted into the concave portions 160. However, the shape of the concave portion 160 and the resistor block 170 is not limited to the conic shape, and the concave portion 160 and the resistor block 170 may be formed in various shapes, for example, cylinders, rectangular prisms or square or rectangular pyramids.

In (a), (b) and (c) of FIG. 8, on the basis of the shape of the concave portion 160, (a) shows that the resistor block 170 of the smallest size is inserted into the concave portion 160, (b) shows that the resistor block 170 of the intermediate size is inserted into the concave portion 160, and (c) shows that the resistor block 170 of the largest size is inserted into the concave portion 160. In the case of (c), the size of the resistor block 170 may match the size of the concave portion 160.

In more detail, in the case of (a), the area of indirect contact between the first connection element 130 and the second connection element 140 is smaller than those of (b) and (c), and thus the resistance value between the first connection terminal 111 and the second connection terminal 121 may be higher. On the contrary, in the case of (c), the area of indirect contact between the first connection element 130 and the second connection element 140 is larger than those of (a) and (b), and thus the resistance value between the first connection terminal 111 and the second connection terminal 121 may be lower.

Additionally, the shunt resistor 100 according to an embodiment of the present disclosure may have a plurality of concave portions 160. For example, as shown in the configuration of FIG. 9, the plurality of concave portions 160 may be formed between the first connection element 130 and the second connection element 140, and the resistor block 170 may be selectively inserted into the plurality of concave portions 160. In more detail, the resistance value between the first connection element 130 and the second connection element 140 may be adjusted by adjusting the number or size of the resistor block 170 inserted into the plurality of concave portions 160.

Through this configuration, the shunt resistor 100 according to the present disclosure may accurately detect the flow of current by decreasing or increasing the resistance value of the shunt resistor 100 very precisely through adjustment of the size or the number of inserted resistor blocks 170.

Meanwhile, the terms importing directions such as up, down, left, right, front and rear are used herein, but this is provided for convenience of description only, and it is obvious to those skilled in the art that the terms may change depending on the position of the stated element or an observer.

While the present disclosure has been hereinabove described with regard to a limited number of embodiments and drawings, the present disclosure is not limited thereto and various modifications and changes may be made by those skilled in the art within the technical aspects of the present disclosure and the equivalent scope of the appended claims.

Although the term 'unit' such as 'detection unit' is used herein, it refers to a logical component unit, and it is obvious to those skilled in the art that the term does not necessarily indicate a component that may or should be physically separated.

DESCRIPTION OF REFERENCE NUMERALS

1: Battery pack
10: Secondary battery
100: Shunt resistor
110: First busbar
111: First connection terminal
120: Second busbar
121: Second connection terminal
130: First connection element
131: First protrusion portion
140: Second connection element
141: Second protrusion portion
150: Resistor bar
160: Concave portion
170: Resistor block
200: Detection unit

What is claimed is:
1. A shunt resistor comprising:
a first busbar, wherein the first busbar is electrically conductive;
a second busbar, wherein the second busbar is electrically conductive and spaced apart a predetermined distance from the first busbar along a lengthwise axis;
a first connection element, wherein the first connection element is electrically conductive and configured to be mounted to the first busbar, and wherein the first connection element extends along the lengthwise axis towards the second busbar when it is mounted to the first busbar; and
a second connection element, wherein the second connection element is electrically conductive and configured to be mounted to the second busbar, and wherein the second connection element extends along the lengthwise axis towards the first busbar when it is mounted to the first second busbar, wherein the first connection element and the second connection element are configured to have a variable area of direct or indirect contact between one another.

2. The shunt resistor according to claim 1, wherein the first connection element and the second connection element are configured to have a variable area of direct contact between one another, wherein the first connection element includes a first interlock that protrudes from the first busbar toward the second busbar along the lengthwise axis, wherein the second connection element includes a second interlock that protrudes from the second busbar toward the first busbar along the lengthwise axis, and wherein the first connection element and the second connection element are configured to directly contact each other when the first interlock and the second interlock are engaged with each other.

3. The shunt resistor according to claim 2, wherein the first interlock includes a first set of teeth protruding upwards, wherein the second interlock includes a second set of teeth protruding downwards, and wherein the teeth of the first set of teeth of the first interlock and of the second set of teeth of the second interlock have matching shapes.

4. The shunt resistor according to claim 2, wherein when the first interlock and the second interlock are engaged with each other, the area of direct contact between the first interlock and the second interlock is configured to vary as the first connection element and the second connection element move along the lengthwise axis.

5. The shunt resistor according to claim 4, wherein the first interlock includes a first set of teeth protruding upwards, wherein the second interlock includes a second set of teeth protruding downwards, wherein each of the first set of teeth and the second set of teeth includes at least two teeth, and wherein as the first connection element and the second connection element move along the lengthwise axis, a number of engaged teeth changes, and the area of direct contact between the first interlock and the second interlock increases or decreases.

6. The shunt resistor according to claim 1, wherein the first connection element and the second connection element are configured to have a variable area of indirect contact between one another, wherein the first connection element includes a first plurality of protrusion portions protruding in a direction towards the second connection element, wherein the second connection element includes a second plurality of protrusion portions protruding in a direction towards the first connection element, wherein the first and second pluralities of protrusions are spaced apart from each other in each of a lengthwise direction along the lengthwise axis and a vertical direction, wherein the shunt resistor further comprises at least one resistor bar mounted between the first connection element and the second connection element, and wherein the at least one resistor bar includes a plate having a first side mounted between two protrusion portions of the first connection element, and a second side mounted between two protrusion portions of the second connection element.

7. The shunt resistor according to claim 6, wherein the at least one resistor bar is configured to be detachable from the first connection element and the second connection element.

8. The shunt resistor according to claim 1, wherein the first connection element includes a first concave portion on a surface of the first connection element configured to contact the second connection element, wherein the second connection element includes a second concave portion on a surface of the second connection element configured to contact the first connection element, wherein when the respective surfaces of the first and second connection elements contact one another, the first and second concave portions form a cavity where the first connection element and the second connection element contact one another, and wherein the shunt resistor further comprises at least one resistor block configured to be inserted into the cavity.

9. The shunt resistor according to claim 8, wherein the cavity is formed in a conic shape, and wherein the shunt resistor comprises a plurality of resistor blocks, wherein each one of the plurality of resistor blocks is formed in a conic shape, is a different size, and is configured to be detachable from the cavity.

10. An apparatus for detecting current, comprising:

a first busbar, wherein the first busbar is electrically conductive;

a second busbar, wherein the second busbar is electrically conductive and spaced apart a predetermined distance from the first busbar along a lengthwise axis;

a first connection element, wherein the first connection element is electrically conductive and configured to be mounted to the first busbar, and wherein the first connection element extends along the lengthwise axis towards the second busbar when it is mounted to the first busbar;

a second connection element, wherein the second connection element is electrically conductive and configured to be mounted to the second busbar, and wherein the second connection element extends along the lengthwise axis towards the first busbar when it is mounted to the first second busbar; and a current detector electrically connected to the first connection element and the second connection element, and configured to detect a current flowing between the first busbar and the second busbar based on a voltage applied between the first connection element and the second connection element, wherein the first connection element and the second connection element are configured to have a variable area of direct or indirect contact between one another.

11. A battery pack comprising the apparatus for detecting current according to claim 10.

* * * * *